(12) United States Patent
Wong et al.

(10) Patent No.: US 7,293,221 B1
(45) Date of Patent: Nov. 6, 2007

(54) METHODS AND SYSTEMS FOR DETECTING MEMORY ADDRESS TRANSFER ERRORS IN AN ADDRESS BUS

(75) Inventors: Samson S. Wong, San Jose, CA (US); Kandasamy Aravinthan, Daly City, CA (US); Gideon N. Levinsky, Austin, TX (US); Shahar Dor, Austin, TX (US); Richard T. Van, Milpitas, CA (US); Jiejun Lu, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 560 days.

(21) Appl. No.: 10/766,743

(22) Filed: Jan. 27, 2004

(51) Int. Cl.
*G11C 29/00* (2006.01)
(52) U.S. Cl. ............................ 714/768
(58) Field of Classification Search ............ 714/768, 714/805, 763, 766
See application file for complete search history.

(56) References Cited

U.S. PATENT DOCUMENTS

| | | | |
|---|---|---|---|
| 5,099,484 A | | 3/1992 | Smelser |
| 5,173,905 A | * | 12/1992 | Parkinson et al. ............ 714/768 |
| 5,226,043 A | * | 7/1993 | Pughe et al. ................. 714/768 |
| 5,345,582 A | | 9/1994 | Tsuchiya |
| 5,453,999 A | * | 9/1995 | Michaelson et al. ......... 714/805 |
| 5,663,969 A | * | 9/1997 | Tsou ............................ 714/805 |
| 5,841,795 A | | 11/1998 | Olarig et al. |
| 5,978,953 A | | 11/1999 | Olarig |
| 6,457,154 B1 | | 9/2002 | Chen et al. |
| 6,751,769 B2 | * | 6/2004 | Chen et al. .................. 714/767 |
| 6,754,858 B2 | * | 6/2004 | Borkenhagen et al. ....... 714/720 |

FOREIGN PATENT DOCUMENTS

WO   WO96/42053   * 12/1996

OTHER PUBLICATIONS

Anonymous, "*Memory Data Error Protection and Sparing using the Power PCI Bridge,*" Bae Systems, AN-5, Version 1.0 (Mar. 2000). <http://www.iewsna.baesystems.com/space/pdf/ecc_and_sparing.pdf>.

* cited by examiner

*Primary Examiner*—Shelly A Chase
(74) *Attorney, Agent, or Firm*—Martine Penilla and Gencarella, LLP

(57) ABSTRACT

A method for detecting transfer errors in an address bus is provided. In this method, a first address parity is generated using a memory address. Next, at least two data error-correction-code (ECC) check bits are scrambled using the first address parity. Subsequently, the data ECC check bits are written to a memory and the data ECC check bits enable detection of transfer errors in the address bus. A system for detecting transfer errors in an address bus is also described.

6 Claims, 8 Drawing Sheets

METHODS AND SYSTEMS FOR DETECTING MEMORY ADDRESS TRANSFER ERRORS IN AN ADDRESS BUS

BACKGROUND OF THE INVENTION

1. Field of the Invention

The present invention relates to error detection and, more particularly, to methods and systems of detecting transfer errors in an address bus.

2. Description of the Related Art

Microprocessors include a hierarchy of memory subsystems. FIG. 1 is a simplified block diagram of a conventional microprocessor with memory subsystems. As shown in FIG. 1, central processing unit (CPU) core 100 is connected to memory subsystems by address buses 106 and data buses 108. The memory subsystems include level 2 on-chip cache 102 for storing data that require low access latency and larger off-chip main memories 104 for storing data that require high access bandwidths.

Transfers of data from CPU core 100 to and from the memory subsystems through data buses 108 are typically protected by Error Correction Code (ECC). However, transfer of memory addresses through address buses 106 are not protected. Adding parity protection to address buses 106 is becoming increasingly important because the sizes of the memory subsystems are increasing rapidly or more memory subsystems are connected to CPU core 100. As a result, address buses 106 are also increasing in size. Larger address buses are more prone to transfer errors because more memory addresses are transferred. Transfer errors may result from electronic noise, faulty wires, electro-migration problems, and poor electrical connections, and the transfer errors cause data to be accessed from and written to incorrect memory addresses. Adding parity protection to address buses 106 normally requires adding a dedicated parity bit to the memory address that results in additional pins. However, a memory module with additional pins cannot plug into existing memory sockets. Adding parity protection to address buses 106 is thus not feasible with existing hardware systems.

In view of the foregoing, there is a need for adding parity protection to the address buses while maintaining existing pin-compatibility.

SUMMARY OF THE INVENTION

Broadly speaking, the present invention fills these needs by providing methods and systems to detect transfer errors in an address bus. It should be appreciated that the present invention can be implemented in numerous ways, including as a process, an apparatus, a system, computer readable media, or a device. Several inventive embodiments of the present invention are described below.

In accordance with a first aspect of the present invention, a method for detecting transfer errors in an address bus is provided. In this method, a first address parity is generated using a memory address. Next, at least two error-correction-code (ECC) check bits are scrambled using the first address parity. Subsequently, the data ECC check bits are written to a memory and the data ECC check bits enable detection of transfer errors in the address bus.

In accordance with a second aspect of the present invention, a method for detecting transfer errors in an address bus is provided. In this method, a second address parity is generated using a memory address. Next, data ECC check bits are read from the memory. Subsequently, at least two previously scrambled data ECC check bits are unscrambled using the second address parity and the data ECC check bits enable detection of transfer errors in the address bus.

In accordance with a third aspect of the present invention, a system for detecting transfer errors in an address bus is provided. The system includes a first parity generator for generating a first address parity using a memory address. Additionally, at least two exclusive-OR operators coupled to the first parity generator for scrambling at least two data ECC check bits using the first address parity. The first parity generator and the at least two exclusive-OR operators coupled to the first parity generator enable detection of transfer errors in the address bus.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Figure 1:
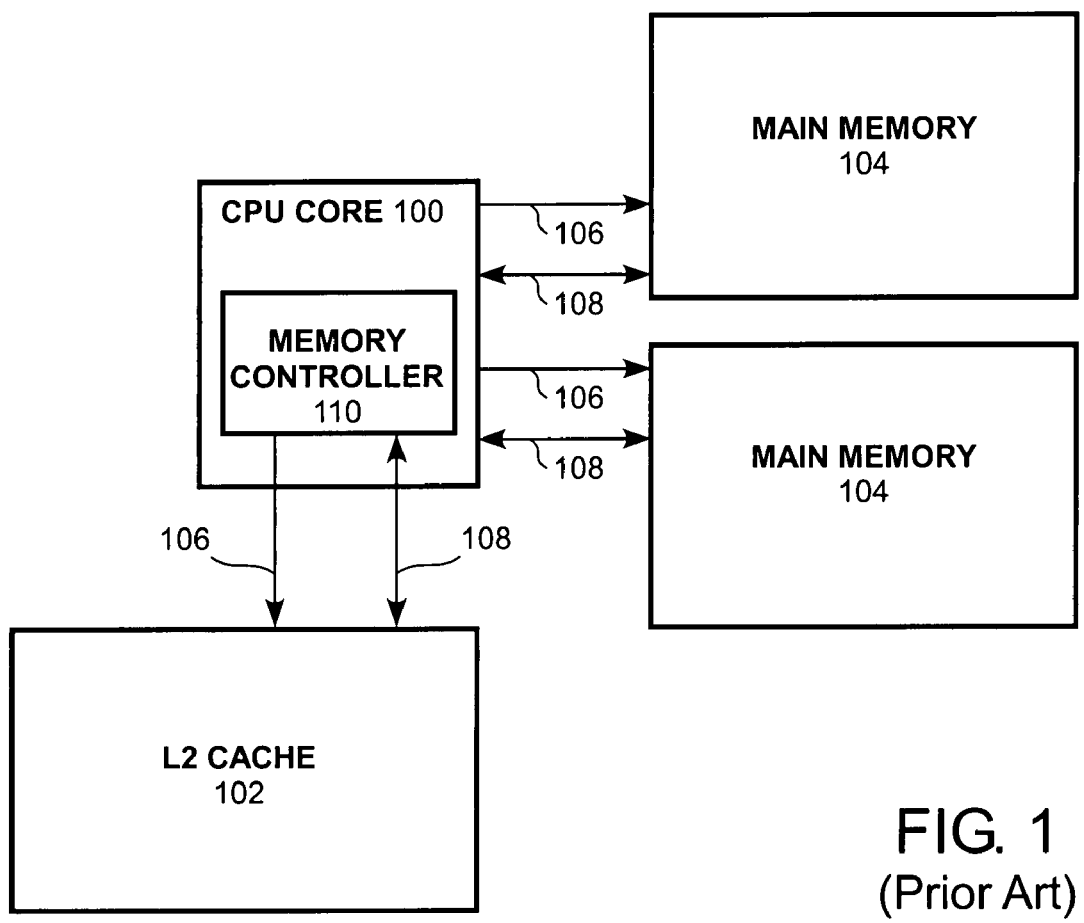
FIG. 1 is a simplified block diagram of a conventional microprocessor with memory subsystems.

An invention is disclosed for methods and systems for detecting transfer errors in an address bus. In the following description, numerous specific details are set forth in order to provide a thorough understanding of the present invention. It will be understood, however, by one of ordinary skill in the art, that the present invention may be practiced without some or all of these specific details. In other instances, well known process operations have not been described in detail in order not to unnecessarily obscure the present invention.

To detect transfer errors of a memory address in an address bus without adding new pins, the embodiments described herein provide methods and systems that utilize existing error correction code (ECC) for data that detects and corrects transfer errors in a data bus. Essentially, data ECC check bits used to detect transfer errors in the data bus are overloaded with an address parity. As will be explained in more detail below, the data ECC check bits signal an ECC error if there is a transfer error in the address bus. The ECC error is then reported to an exception-handling software program that is able to examine the ECC error more closely and take appropriate actions.

Since embodiments of the present invention described herein rely on ECC, a general description of ECC is provided. As is known to those skilled in the art, ECC is implemented to protect data transfers in the data bus between a central processing unit (CPU) core and a memory. The memory includes on-chip cache memory (e.g., L2 cache) and off-chip memory. Examples of on-chip cache memories and off-chip memories include static random access memory (SRAM) and dynamic random access memory (DRAM). To protect data, data ECC check bits are added to data to detect transfer errors in the data bus. An ECC check signals no transfer error when a syndrome contains all zeros (i.e., all syndrome bits have a zero value). If a transfer error is detected, the ECC check produces a non-zero syndrome (i.e., one or more ECC syndrome bits have a one value). In general, the mathematical relationship between data ECC check bits and syndrome bits is as follows:

$$D_{[1,M]} \times G_{[M,N]} = C_{[1,N]}$$

$$H_{[K,N]} \times C^T_{[N,1]} = S_{[K,1]}$$

$$N = M + K$$

As shown above, D=data word, G=generator matrix, C=code word, H=parity check matrix, S=syndrome, and K=data ECC check bits.

The categorization and detection of transfer errors depend on the types of ECC used in a hardware system. Examples of ECC types include Single Error Correction and Double Error Detection Error Correction Code (SEC-DED ECC), Single Error Correction and Triple Error Detection Error Correction Code (SEC-TED ECC), Double Error Correction and Triple Error Detection Error Correction Code (DEC-TED ECC), Triple Error Correction and Quadruple Error Detection (TEC-QED ECC), etc. Since SEC-DED ECC is the simplest ECC type and most commonly used in the industry, a general description of SEC-DED ECC is provided. In SEC-DED ECC, a transfer error is categorized as either a single-bit data ECC error or a double-bit data ECC error. The single-bit data ECC error is defined as an ECC check producing a non-zero syndrome that matches a single, unique column in the parity check matrix for the ECC. The position of the matching column corresponds to a position of the bit in error. A hardware system using SEC-DED ECC to protect data transfers in the data bus can automatically correct data with the single-bit data ECC error.

On the other hand, a double-bit data ECC error is defined as the ECC check producing a non-zero syndrome that does not match any columns in the parity check matrix for the ECC. For SEC-DED ECC, data with double-bit data ECC error is detectable but not automatically correctable by the hardware system. Instead, the hardware system reports such double-bit data ECC error to a more sophisticated exception-handling software that is able to process the data with the double-bit data ECC error. As such, the double-bit data ECC error is referred to as a signaling ECC error because the hardware system signals the occurrence of the double-bit data ECC error to an exception-handling software instead of automatically correcting the double-bit data ECC error. The above general description of SEC-DED ECC also applies to SEC-TED ECC, DEC-TED ECC, and TEC-QED ECC, with the main difference being the number of correctable bits and number of syndrome bits used in error detection. For more information on ECC, reference may be made to a book entitled "Error-Correcting Codes" by W. Wesley Peterson and E. J. Weldon, Jr. (1972), and a book entitled "Practical Error Correction Design for Engineers" by Neal Glover and Trent Dudly, p. 271 (1991). These books are herein incorporated by reference in their entirety.

Figure 2:
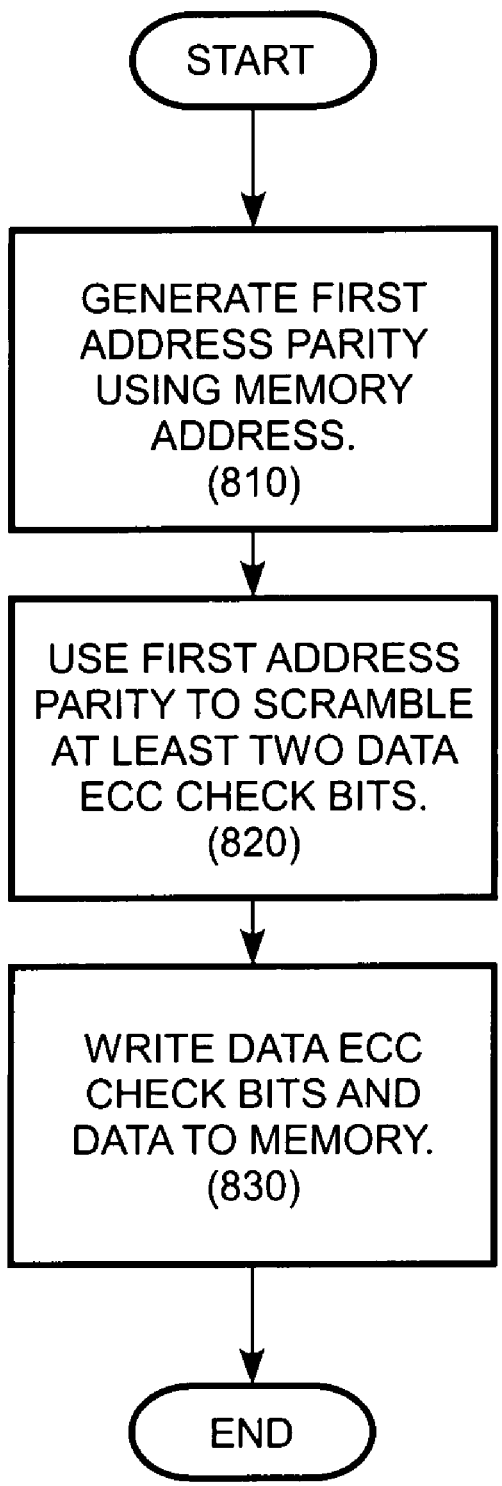
FIG. 2 is a flowchart diagram illustrating a high level overview of the method operations during a write operation, in accordance with one embodiment of the present invention.

FIG. 2 is a flowchart diagram illustrating a high level overview of the method operations during a write operation, in accordance with one embodiment of the present invention. Starting in operation 810, when a CPU wants to write data to a memory at a specific memory address, a first address parity is generated using the memory address. Thereafter, in operation 820, depending on the ECC type used, at least two data ECC check bits are scrambled using the first address parity. Exemplary embodiments include scrambling two data ECC check bits for SEC-DED ECC, scrambling three data ECC check bits for SEC-TED ECC and DEC-TED ECC, and scrambling four data ECC check bits for TEC-QED ECC. Subsequently, the data and the data ECC check bits are written to the memory in operation 830.

Figure 3:
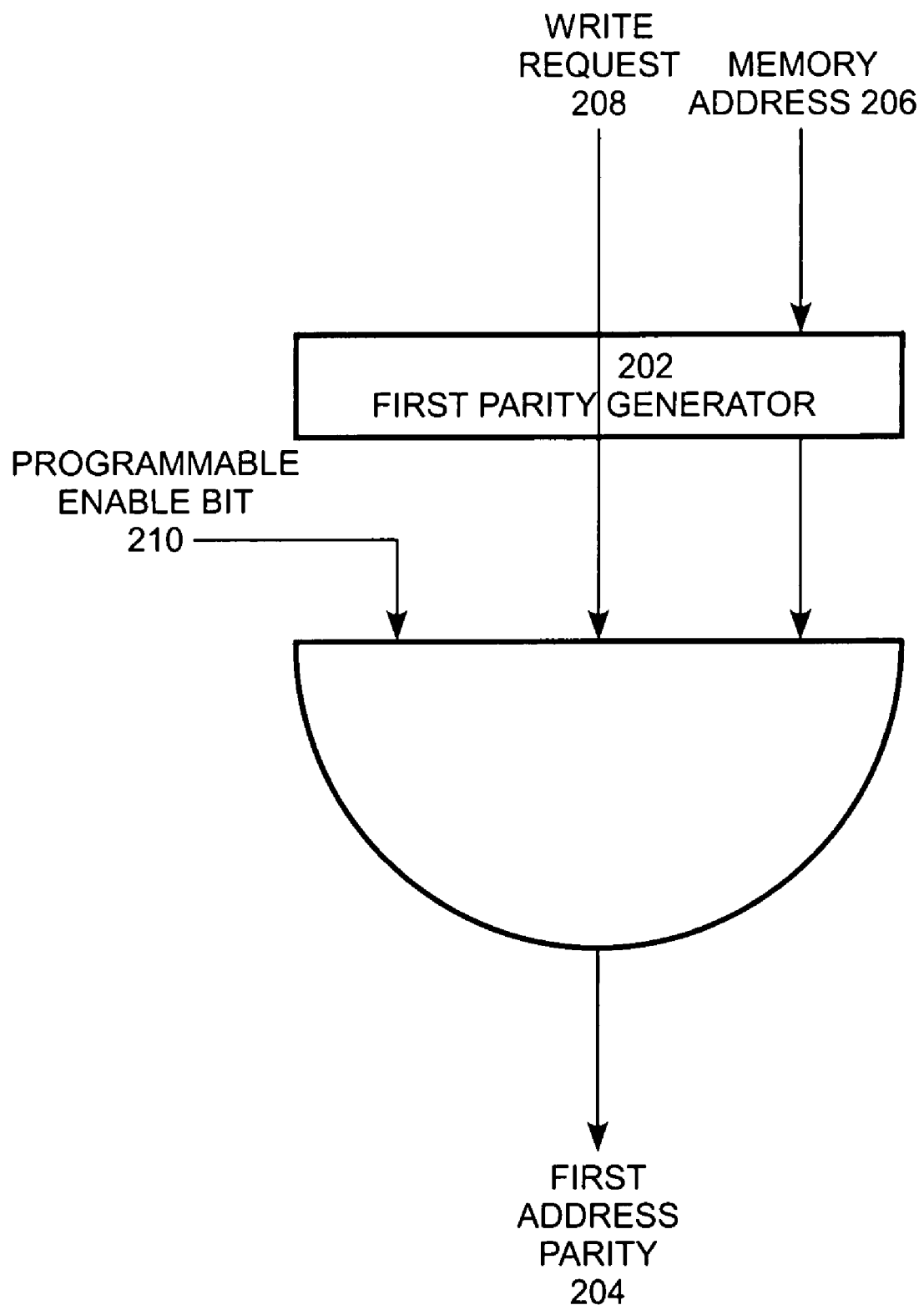
FIG. 3 is a simplified schematic diagram illustrating the generation of a first address parity, in accordance with one embodiment of the present invention.

FIG. 3 is a simplified schematic diagram illustrating the generation of a first address parity, in accordance with one embodiment of the present invention. As shown in FIG. 3, a CPU first issues valid write request 208 to write data to a memory at memory address 206. Parity generator 202 generates first address parity 204 by using an exclusive-OR (XOR) function on all the bits of memory address 206. First parity generator 202 generates an even first address parity 204. Alternatively, first parity generator 202 may also generate an odd first address parity with the addition of an inverter (not shown) in the first parity generator. As will be explained in more detail below, programmable enable bit 210 basically specifies that the existing hardware system supports the detection of transfer errors in an address bus and, as a result, enables the generation of first address parity 204 using memory address 206.

Figure 4:
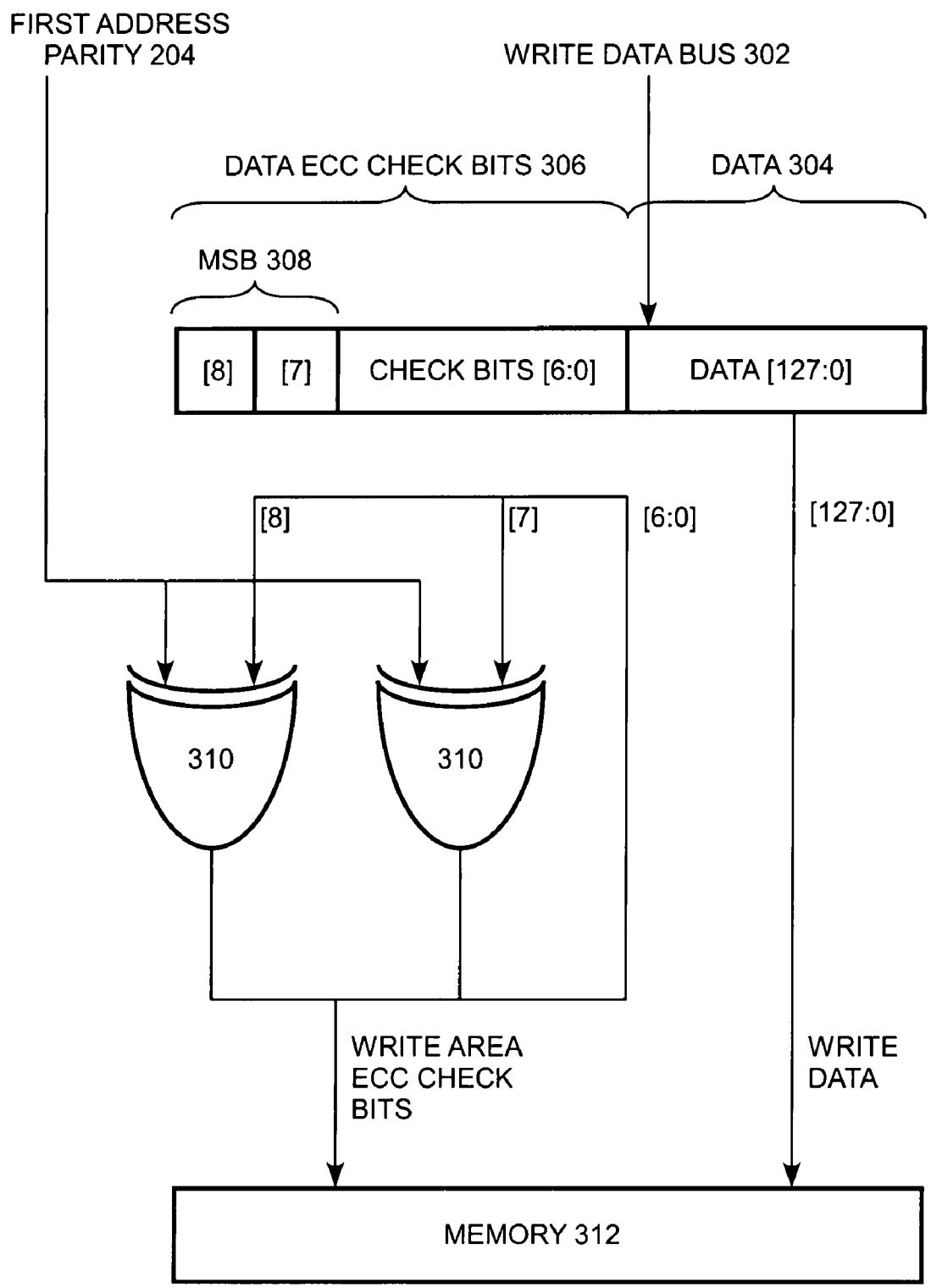
FIG. 4 is a simplified schematic diagram illustrating the scrambling of data ECC check bits using first address parity in a system that uses Single Error Correction and Double Error Detection Error Correction Code (SEC-DED ECC), in accordance with one embodiment of the present invention.

FIG. 4 is a simplified schematic diagram illustrating the scrambling of data ECC check bits 306 using first address parity 204 in a system that uses SEC-DED ECC, in accordance with one embodiment of the present invention. Data ECC check bits 306 are added to data 304 to protect the data. Although FIG. 4 shows data 304 to be 128 bits in length and data ECC check bits 306 to be nine bits in length, the data and the data ECC check bits can be any suitable length.

As shown in FIG. 4, data 304 is directly written to memory 312. However, data ECC check bits 306 are not directly written to memory 312. Instead, two data ECC check bits 306 are separately scrambled using first address parity 204. Two data ECC check bits 308 need to be scrambled because scrambling only one data ECC check bit will result in a single-bit data ECC error. As discussed above, the hardware system with SEC-DED ECC automatically corrects the single-bit data ECC error. If the single-bit data ECC error is automatically corrected, then the hardware system will not report the ECC error to a more sophisticated exception-handling software. In effect, scrambling two data ECC check bits 308 forces a transfer error in the address bus into a double-bit data ECC error which, as discussed above, is then reported to the exception-handling software. Any two data ECC check bits, such as ECC check bits 398, can be scrambled. In one embodiment, as shown in FIG. 4, two most significant bits (MSB) 308 (i.e., the last two seventh and eights bits) of data ECC check bits 306 are scrambled. In another embodiment, the two least significant bits (i.e., the first two bits) of data ECC check bits 306 can be scrambled.

To scramble two MSB 308 using first address parity 204, the two MSB and the first address parity are inputted into two XOR operators 310 to generate two scrambled outputs. Alternatively, XNOR operators can be used to scramble two MSB 308 using first address parity 204. After the two MSB 308 of data ECC check bits 306 are scrambled, the data ECC check bits are written to memory 312 along with data 304.

Figure 5:
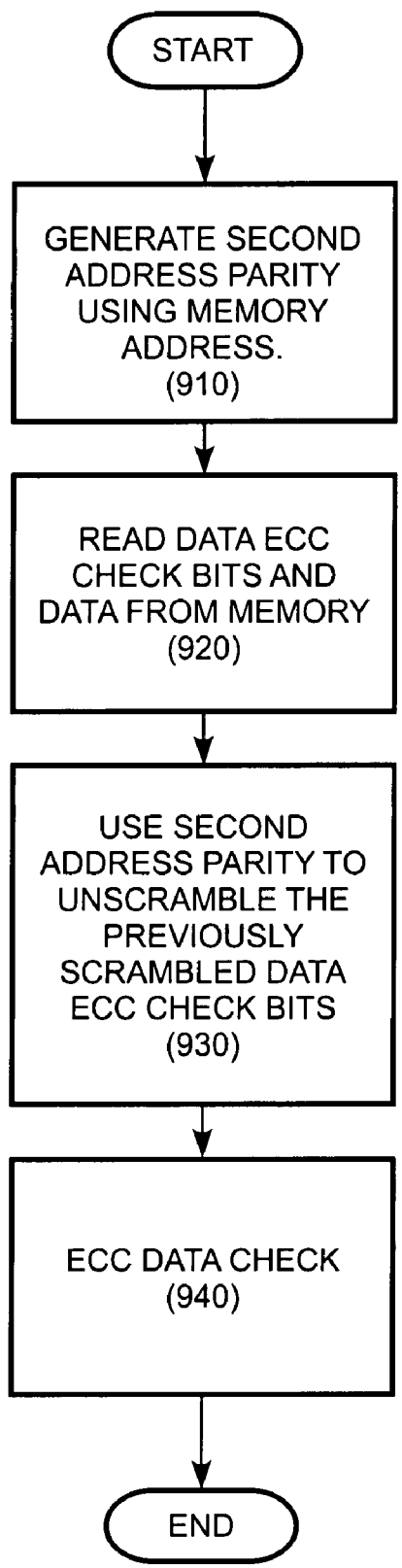
FIG. 5 is a flowchart diagram illustrating a high level overview of the method operations during a read operation, in accordance with one embodiment of the present invention.

FIG. 5 is a flowchart diagram illustrating a high level overview of the method operations during a read operation, in accordance with one embodiment of the present invention. Starting in operation 910, when a CPU wants to read the previously scrambled data discussed above from the same memory address, a second address parity is generated using the memory address. Thereafter, in operation 920, the data along with the data ECC check bits are read from memory. The previously scrambled data ECC check bits are then unscrambled using the second address parity in operation 930. Finally, an ECC data check operation is conducted in operation 940 to detect both a transfer error in a data bus and a transfer error in an address bus.

Figure 6:
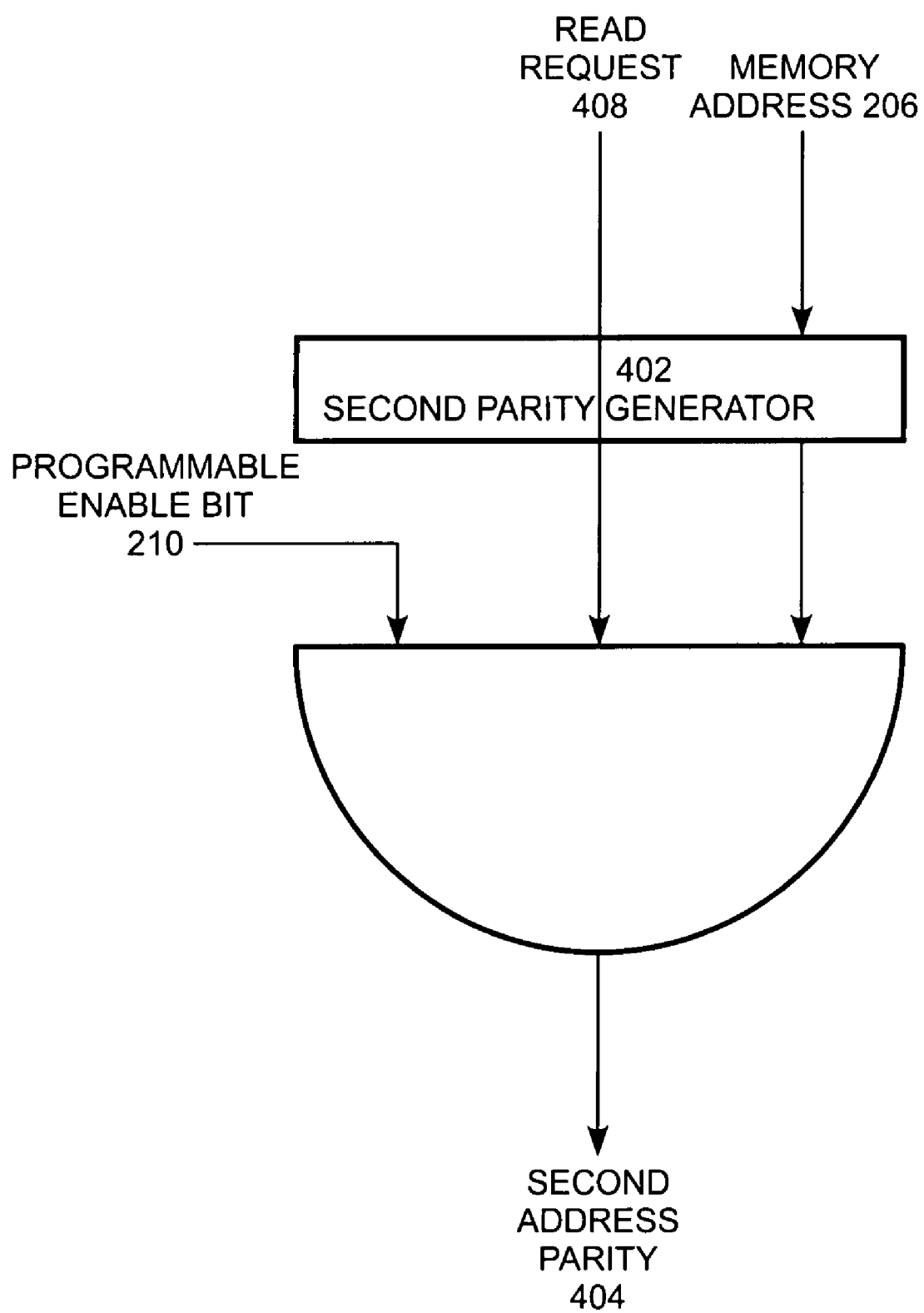
FIG. 6 is a simplified schematic diagram illustrating the generation of a second address parity, in accordance with one embodiment of the present invention.

FIG. 6 is a simplified schematic diagram illustrating the generation of a second address parity, in accordance with one embodiment of the present invention. Essentially, the logic in generating second address parity 404 is identical to generating a first address parity shown in FIG. 3. The rational to regenerate second address parity 404 with memory address 206 is to essentially compare the recomputed second address parity with the first address parity stored in a memory. In effect, as will be explained in more detail below, a difference between second address parity 404 and the first address parity signals a transfer error in the address bus. As shown in FIG. 6, a CPU first issues a valid read request 408 to read data from a memory at memory address 206. Second parity generator 402 generates second address parity 404 by using an XOR function on all the bits of memory address 206. Second parity generator 402 generates an even second address parity 404. Alternatively, second parity generator 402 may also generate an odd second address parity with the addition of an inverter (not shown) in the second parity generator. As will be explained in more detail below, programmable enable bit 210 basically specifies that the existing hardware system supports the detection of transfer errors in an address bus and, as a result, enables the generation of second address parity 404 using memory address 206.

Figure 7:
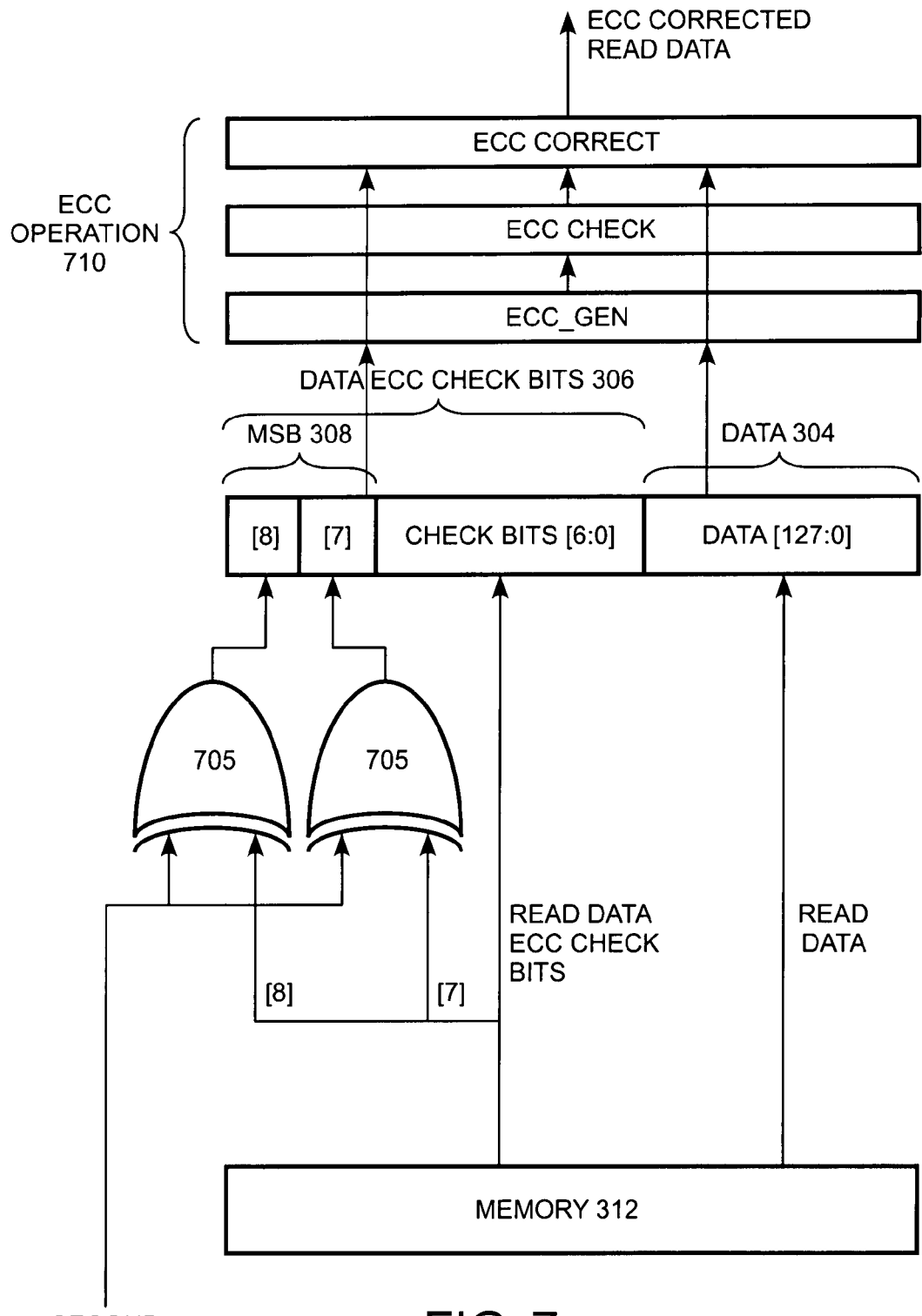
FIG. 7 is a simplified schematic diagram illustrating the unscrambling of data ECC check bits using second address parity in a system that uses SEC-DED ECC, in accordance with one embodiment of the present invention.

FIG. 7 is a simplified schematic diagram illustrating the unscrambling of data ECC check bits 306 using second address parity 404 in a system that uses SEC-DED ECC, in accordance with one embodiment of the present invention. As shown in FIG. 7, data 304 and data ECC check bits 306 are read from memory 312 through a data bus. Before ECC operation 710 is executed, two XOR operators 705 are used to unscramble two MSB 308 of data ECC check bits 306 that was previously scrambled in the write operation. To unscramble two MSB 308 of data ECC check bits 306 using second address parity 404, the two MSB and the second address parity are inputted into two XOR operators 705 to generate two unscrambled outputs.

Subsequently, ECC operation 710 is executed on data 304 and data ECC check bits 306. Typically, ECC operation 710 detects transfer errors in a data bus as well as correcting data with single-bit data ECC errors. However, by using the memory address to scramble and unscramble data ECC check bits 306, ECC operation 710 may detect transfer errors in both the data bus and an address bus. As discussed above, scrambling and unscrambling two MSB 308 of data ECC check bits 306 forces a transfer error in the address bus into a double-bit data ECC error. ECC operation 710 reports the double-bit data ECC error and, as a result, the CPU issues an exception and hands over program control to an exception handling software program. The software program can examine the double-bit data ECC error more closely and take appropriate actions. For example, the software program can be programmed to separate a data transfer error from a memory address transfer error. The software program may then correct any errors in the memory address. Alternatively, the software program may instruct the CPU to simply ignore the first read operation and to make another read request for the same data.

Figure 8:
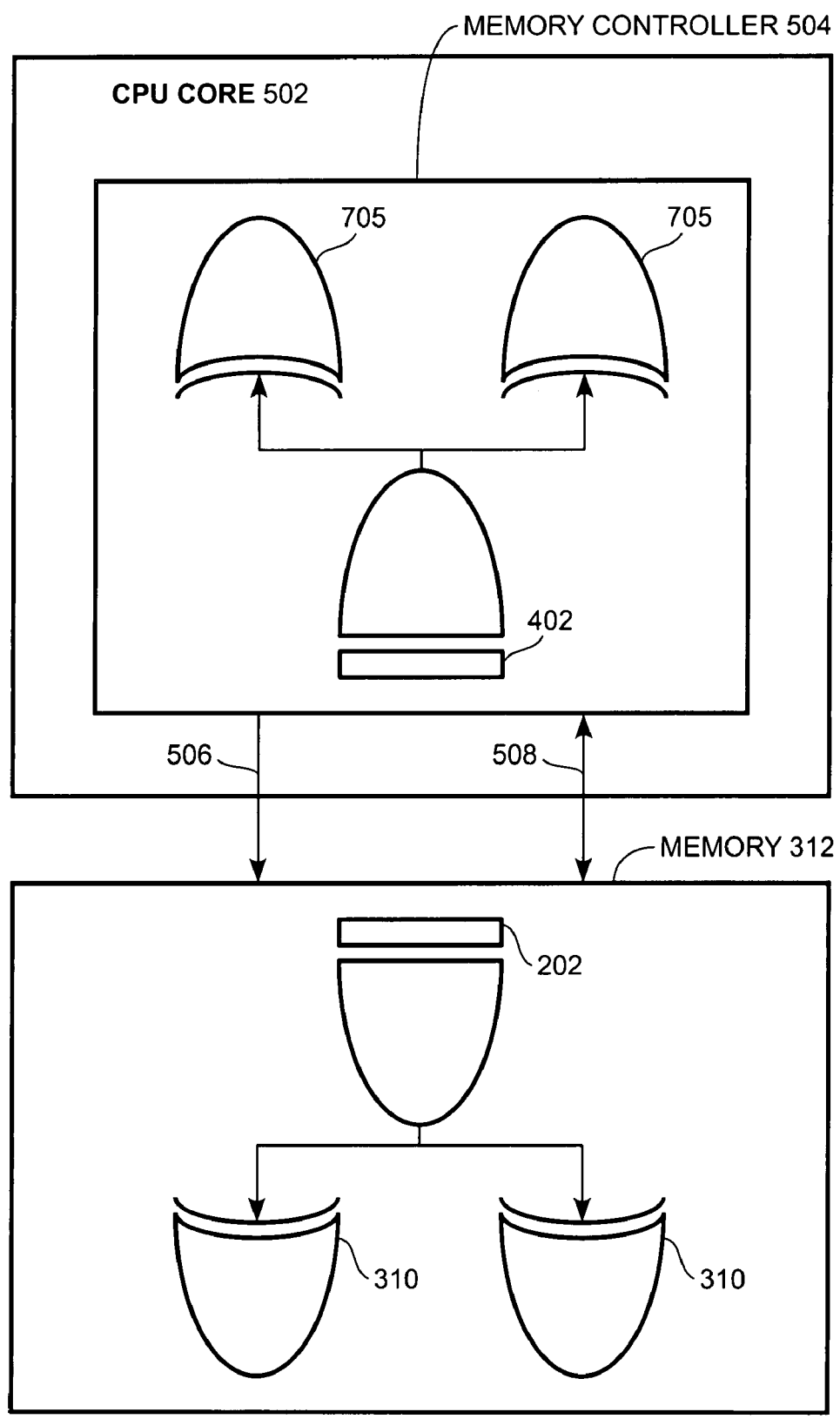
FIG. 8 is a simplified block diagram of a hardware system with SEC-DED ECC configured to detect transfer errors in an address bus, in accordance with one embodiment of the present invention.

FIG. 8 is a simplified block diagram of a hardware system with SEC-DED ECC configured to detect transfer errors in address bus 506, in accordance with one embodiment of the present invention. As shown in FIG. 8, CPU core 502 is coupled to memory 510 by address bus 506 and data bus 508. Memory controller is located in CPU core 502 but can also be located outside the CPU core. In one embodiment, first parity generator 202 used to generate a first address parity and two XOR operators 310 used to scramble data ECC check bits 306 shown in FIGS. 3 and 4 are located in memory 312. Second parity generator 402 used to generate a second address parity and two XOR operators 705 used to unscramble data ECC check bits 306 shown in FIGS. 6 and 7 are located in memory controller 504. In another embodiment, first parity generator 202, second parity generator 402, and all XOR operators 310, 402 may be integrated together in memory controller 504 for simplification.

FIGS. 4, 7, and 8 illustrate schematic and block diagrams that apply to systems using SEC-DED ECC, in accordance with one embodiment of the present invention. However, as discussed above, the systems may use other ECC types such as SEC-TED ECC, DEC-TED ECC, TEC-QED ECC, etc. The use of SEC-TED ECC, DEC-TED ECC, and TEC-QED ECC requires the scrambling and unscrambling of at least two data ECC check bits. For example, SEC-TED ECC and DED-TED ECC require three ECC check bits to be scrambled and unscrambled, and TEC-QED ECC requires four ECC check bits to be scrambled and unscrambled. More data ECC check bits may be scrambled and unscrambled by simply adding more XOR or XNOR operators.

The embodiments described herein to detect transfer errors in an address bus is not supported in all existing hardware systems. Instead, the hardware system needs to include the logic described above to implement detection of transfer errors in the address bus. To trigger detection of transfer errors, a new programmable bit in an existing register (e.g., L2 cache configuration register) is defined to enable or disable the generation of an address parity using a memory address. Additional bits may be defined for testing purposes. The following Table A is an exemplary embodiment of settings to test, enable, and disable the detection of transfer errors in the address bus.

TABLE A

| MAPE | MAPF | MAP | Use |
| --- | --- | --- | --- |
| 0 | Don't care | Don't care | Disable the address parity feature. Address parity not generated or checked. Data ECC check bits not affected. This is the default. |
| 1 | 0 | Don't care | Enable address parity generation and checking. Use address parity generated for read and write operations. |
| 1 | 1 | 0 | Enable address parity generation and checking. Force zero as first address parity for write operations. Use internally generated second address parity for read operations. |
| 1 | 1 | 1 | Enable address parity generation and checking. Force one as first address parity for write operations. Use internally generated second address parity for reads. |

Table A shows that when the Memory Address Parity Enable (MAPE) bit is set to one, the detection of transfer errors in an address bus is enabled. Alternatively, when the MAPE bit is set to zero, the detection of transfer errors in the address bus is disabled and data ECC check bits are not affected. The MAPE bit should read 1'b0 after reset.

Memory Address Parity Forced (MAPF) and (Manual Address Parity) MAP bits are reserved for testing purposes such that a user may diagnose and detect a problem with this new feature of detecting errors in the address bus. One way to troubleshoot the new feature is to force a wrong address parity to check whether the logic detects the transfer error. A mechanism is provided such that the user can force a wrong address parity value into the memory and verify on a subsequent read using the same memory address. As shown in Table A, when MAP bit is set to one, first address parity is set to one for write operations. In contrast, the second address parity is generated normally for read operations. MAP bit should read 1'b0 after reset. When MAPF bit is set to one and MAP bit is set to zero, first address parity is set to zero for write operations. Again, the second address parity is generated normally for read operations. MAPF bit should also read 1'b0 after reset.

In summary, by using existing data ECC protection to detect transfer error in an address bus, the present invention avoids adding a dedicated parity bit for address checking. As a result, new pins are not needed and the present invention can be implemented into existing hardware systems without compromising pin compatibility.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can be thereafter read by a computer system. The computer readable medium also includes an electromagnetic carrier wave in which the computer code is embodied. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion.

The above described invention may be practiced with other computer system configurations including hand-held devices, microprocessor systems, microprocessor-based or programmable consumer electronics, minicomputers, mainframe computers and the like. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for detecting transfer errors in an address bus, comprising:
   generating a first address parity using a memory address;
   scrambling at least two data error-correction-code (ECC) check bits using the first address parity; and
   writing the data ECC check bits to a memory, the data ECC check bits enabling detection of transfer errors in the address bus;
   generating a second address parity using the memory address;
   reading the data ECC check bits from the memory; and
   unscrambling the at least two data ECC check bits using the second address parity, the data ECC check bits enabling detection of transfer errors in the address bus;
   wherein the method operation of unscrambling the at least two data ECC check bits is selected from one of using an exclusive-OR function and using an exclusive-NOR function.

2. The method of claim 1, further comprising:
   executing an ECC operation; and
   reporting an ECC error to an exception-handling software if the at least two data ECC check bits signal an error.

3. A method for detecting transfer errors in an address bus, comprising:
   generating a first address parity using a memory address;
   scrambling at least two data error-correction-code (ECC) check bits using the first address parity; and
   writing the data ECC check bits to a memory, the data ECC check bits enabling detection of transfer errors in the address bus;
   wherein the at least two data ECC check bits are selected from the group consisting of two most significant bits and two least significant bits.

4. A method for detecting transfer errors in an address bus, comprising:

generating a second address parity using a memory address;

reading data error-correction-code (ECC) check bits from the memory; and unscrambling at least two previously scrambled data ECC check bits using the second address parity, the data ECC check bits enabling detection of transfer errors in the address bus;

executing an ECC operation; and reporting an ECC error to an exception-handling software if the at least two previously scrambled data ECC check bits signal an error.

5. A method for detecting transfer errors in an address bus, comprising:

generating a second address parity using a memory address;

reading data error-correction-code (ECC) check bits from the memory; and unscrambling at least two previously scrambled data ECC check bits using the second address parity, the data ECC check bits enabling detection of transfer errors in the address bus;

wherein the method operation of unscrambling the at least two previously scrambled data ECC check bits is selected from one of using an exclusive-OR function and using an exclusive-NOR function.

6. A method for detecting transfer errors in an address bus, comprising:

generating a second address parity using a memory address;

reading data error-correction-code (ECC) check bits from the memory; and unscrambling at least two previously scrambled data ECC check bits using the second address parity, the data ECC check bits enabling detection of transfer errors in the address bus;

wherein the at least two previously scrambled data ECC check bits are selected from the group consisting of two most significant bits and two least significant bits.

* * * * *